United States Patent
Seo

(10) Patent No.: US 8,317,387 B2
(45) Date of Patent: Nov. 27, 2012

(54) LIGHT EMITTING DIODE PACKAGE, AND BACKLIGHT UNIT AND DISPLAY DEVICE USING THE SAME

(75) Inventor: Bu Wan Seo, Pyeongtaek-si (KR)

(73) Assignee: LG Electronics Inc., Seoul (KR)

( * ) Notice: Subject to any disclaimer, the term of this patent is extended or adjusted under 35 U.S.C. 154(b) by 338 days.

(21) Appl. No.: 12/728,001

(22) Filed: Mar. 19, 2010

(65) Prior Publication Data
US 2010/0315834 A1    Dec. 16, 2010

(30) Foreign Application Priority Data

Jun. 15, 2009   (KR) .................. 10-2009-0052805
Oct. 16, 2009   (KR) .................. 10-2009-0098844

(51) Int. Cl.
*F21V 7/04*  (2006.01)
*H01L 33/00*  (2010.01)

(52) U.S. Cl. ............. 362/612; 362/249.02; 362/294; 362/373; 257/98; 257/99; 257/100

(58) Field of Classification Search ............ 362/612, 362/294, 373, 249.02; 257/98–100
See application file for complete search history.

(56) References Cited

U.S. PATENT DOCUMENTS

| | | | |
|---|---|---|---|
| 5,704,703 A | 1/1998 | Yamada et al. | 362/27 |
| 5,717,422 A | 2/1998 | Fergason | 345/102 |
| 6,011,602 A | 1/2000 | Miyashita et al. | 349/65 |
| 6,241,358 B1 | 6/2001 | Higuchi et al. | 362/31 |
| 6,456,343 B2 | 9/2002 | Kim et al. | 349/58 |
| 6,816,141 B1 | 11/2004 | Fergason | 345/88 |
| 7,125,152 B2 | 10/2006 | Lin et al. | 362/609 |
| 7,311,431 B2 | 12/2007 | Chew et al. | 362/613 |
| 7,312,838 B2 | 12/2007 | Hwang et al. | 349/58 |
| 7,413,330 B2 | 8/2008 | Furukawa | 362/600 |
| 7,641,375 B2 | 1/2010 | Fujita et al. | 362/617 |
| 7,855,391 B2 * | 12/2010 | Park et al. | 257/98 |
| 8,071,997 B2 * | 12/2011 | Scotch et al. | 257/99 |
| 8,113,704 B2 | 2/2012 | Bae et al. | 362/613 |
| 8,192,056 B2 * | 6/2012 | Villard | 362/294 |
| 2001/0017774 A1 | 8/2001 | Ito et al. | 362/31 |
| 2003/0206253 A1 | 11/2003 | Cho | 349/61 |
| 2003/0231483 A1 | 12/2003 | Higashiyama | 362/31 |
| 2005/0248939 A1 | 11/2005 | Li et al. | 362/225 |
| 2005/0276075 A1 | 12/2005 | Chen et al. | 362/615 |
| 2006/0044830 A1 | 3/2006 | Inoue et al. | 362/614 |
| 2006/0114690 A1 | 6/2006 | Iki et al. | 362/612 |

(Continued)

FOREIGN PATENT DOCUMENTS

EP    0 987 490 B1    3/2000

(Continued)

OTHER PUBLICATIONS

United States Notice of Allowance dated Apr. 4, 2012 issued in U.S. Appl. No. 12/768,982.
Final Office Action dated Feb. 17, 2011 issued in U.S. Appl. No. 12/618,603.

(Continued)

*Primary Examiner* — Stephen F Husar
*Assistant Examiner* — James Cranson, Jr.
(74) *Attorney, Agent, or Firm* — KED & Associates, LLP

(57) ABSTRACT

A light emitting diode package may be provided that includes a light emitting diode chip and a heat sink. Heat generated from the light emitting diode chip may be radiated to the outside using the heat sink.

19 Claims, 19 Drawing Sheets

U.S. PATENT DOCUMENTS

| | | | |
|---|---|---|---|
| 2006/0209564 A1 | 9/2006 | Lin et al. | 362/609 |
| 2006/0221638 A1 | 10/2006 | Chew et al. | 362/613 |
| 2006/0239033 A1 | 10/2006 | Jung et al. | 362/612 |
| 2006/0245213 A1 | 11/2006 | Beil et al. | 362/616 |
| 2007/0019419 A1 | 1/2007 | Hafuka et al. | 362/373 |
| 2007/0058390 A1 | 3/2007 | Sugawara et al. | 356/560 |
| 2007/0076434 A1 | 4/2007 | Uehara et al. | 362/616 |
| 2007/0247869 A1 | 10/2007 | Lang et al. | 362/612 |
| 2007/0247871 A1 | 10/2007 | Yoo | 362/612 |
| 2008/0043171 A1 | 2/2008 | Takahashi et al. | 349/65 |
| 2008/0205080 A1 | 8/2008 | Erchak et al. | 362/613 |
| 2009/0190072 A1 | 7/2009 | Nagata et al. | 349/96 |
| 2009/0303410 A1 | 12/2009 | Murata et al. | 349/58 |
| 2010/0046201 A1* | 2/2010 | Wang et al. | 362/97.1 |
| 2010/0149836 A1 | 6/2010 | Hung et al. | 362/634 |
| 2011/0051045 A1 | 3/2011 | Hur et al. | 349/65 |

FOREIGN PATENT DOCUMENTS

| | | |
|---|---|---|
| JP | 64-29708 U | 2/1989 |
| JP | 01-261692 A | 10/1989 |
| JP | 08-160425 A | 6/1996 |
| JP | 09-171111 A | 6/1997 |
| JP | 09-186825 A | 7/1997 |
| JP | 09-292531 A | 11/1997 |
| JP | 11-288611 A | 10/1999 |
| JP | 2002-228844 A | 8/2002 |
| JP | 2004-206916 A | 7/2004 |
| JP | 2005-259361 A | 9/2005 |
| JP | 2005-317480 A | 11/2005 |
| JP | 2006-054410 A | 2/2006 |
| JP | 2006-108033 A | 4/2006 |
| JP | 2006-134748 A | 5/2006 |
| JP | 2006-269364 A | 10/2006 |
| JP | 2006-286638 A | 10/2006 |
| JP | 2007-250197 A | 9/2007 |
| JP | 2007-250979 A | 9/2007 |
| JP | 2007-265837 A | 10/2007 |
| JP | 2007-293339 A | 11/2007 |
| JP | 2008-108622 A | 5/2008 |
| JP | 2008-108623 A | 5/2008 |
| JP | 2008-192395 A | 8/2008 |
| JP | 2009-054990 A | 3/2009 |
| KR | 10-2001-0012532 A | 2/2001 |
| KR | 10-2001-0085460 A | 9/2001 |
| KR | 10-2003-016631 A | 3/2003 |
| KR | 10-2005-0067858 A | 7/2005 |
| KR | 10-2005-0067903 A | 7/2005 |
| KR | 10-2005-0112661 A | 12/2005 |
| KR | 10-2006-0106774 A | 10/2006 |
| KR | 10-2007-0001657 A | 1/2007 |
| KR | 10-2007-0002920 A | 1/2007 |
| KR | 10-2007-0029365 A | 3/2007 |
| KR | 10-2007-0104149 A | 10/2007 |
| KR | 10-2008-0070214 A | 7/2008 |
| KR | 10-2008-0078210 A | 8/2008 |
| KR | 10-2009-0022350 A | 3/2009 |
| KR | 10-2009-0040673 A | 4/2009 |
| KR | 10-2009-0109766 A | 10/2009 |
| WO | WO 2009/017067 A1 | 2/2009 |
| WO | WO 2010/038516 A1 | 4/2010 |

OTHER PUBLICATIONS

PCT International Search Report and Written Opinion dated Jan. 8, 2010 issued in Application No. PCT/KR2009/002782.
Korean Office Action dated Feb. 22, 2010 issued in Application No. 10-2008-0061487.
U.S. Office Action dated May 25, 2011 issued in U.S. Appl. No. 12/453,885.
PCT International Search Report and Written Opinion dated Jun. 23, 2010 issued in Application No. PCT/KR2009/005992.
U.S. Office Action dated Sep. 7, 2010 issued in U.S. Appl. No. 12/618,603.
European Search Report dated Apr. 26, 2011 issued in Application No. 10 01 5492.
Korean Notice of Allowance dated Aug. 30, 2011 issued in Application No. 10-2008-0049146 (English translation).
European Search Report dated Aug. 30, 2011 issued in Application No. 09 75 5013.
U.S. Office Action dated Oct. 25, 2011 issued in U.S. Appl. No. 12/727,966.
PCT International Search Report dated Oct. 27, 2010 issued in Application No. PCT/KR2010/001492.
PCT International Search Report dated Oct. 29, 2010 issued in Application No. PCT/KR2010/001485.
Korean Office Action dated Dec. 21, 2010 issued in Application No. 10-2008-0049146.
Korean Office Action dated Dec. 21, 2010 issued in Application No. 10-2008-0099569.
Korean Office Action dated Apr. 9, 2010 issued in Application No. 10-2009-0113708.
Korean Office Action dated Oct. 11, 2010 issued in Application No. 10-2009-0053260.
International Search Report dated Oct. 27, 2010 issued in Application No. PCT/KR2010/001963.
United States Final Office Action dated Nov. 3, 2011 issued in Application U.S. Appl. No. 12/453,885.
Korean Notice of Allowance dated Nov. 30, 2011 issued in Application No. 10-2008-0049146 (with English translation).
PCT International Search Report dated Oct. 28, 2010 issued in Application No. PCT/KR2010/001422.
PCT International Search Report dated Oct. 28, 2010 issued in Application No. PCT/KR2010/001423.
PCT International Search Report dated Oct. 28, 2010 issued in Application No. PCT/KR2010/001424.
PCT International Search Report dated Oct. 28, 2010 issued in Application No. PCT/KR2010/001425.
PCT International Search Report dated Sep. 30, 2010 issued in Application No. PCT/KR2010/001067.
PCT International Search Report dated Sep. 30, 2010 issued in Application No. PCT/KR2010/001420.
U.S. Office Action dated Feb. 1, 2012 issued in U.S. Appl. No. 12/632,694.
United States Office Action dated Jun. 13, 2012 issued in U.S. Appl. No. 12/728,065.
United States Office Action dated Sep. 6, 2012 issued in U.S. Appl. No. 12/728,087.
United States Office Action dated Sep. 26, 2012 issued in U.S. Appl. No. 12/728,111.
United States Office Action dated Sep. 27, 2012 issued in U.S. Appl. No. 12/728,131.

* cited by examiner (a)

(b)

(a)

(b)

(a)

(b)

LIGHT EMITTING DIODE PACKAGE, AND BACKLIGHT UNIT AND DISPLAY DEVICE USING THE SAME

CROSS REFERENCE TO RELATED APPLICATION

This application claims priority under 35 U.S.C. §119 and 35 U.S.C. §365 to Korean Applications Nos. 10-2009-0052805, filed on Jun. 15, 2009, and 10-2009-0098844 filed on Oct. 16, 2009 whose entire disclosures are incorporated herein by reference.

BACKGROUND

1. Field

Embodiments of the present disclosure may relate to a light emitting diode package having a heat sink, and a backlight unit and a display device using the same.

2. Background

A liquid crystal display (LCD), which is a kind of display, may be used in various devices, such as televisions, laptop computers, monitors for desktop computers, and/or mobile phones.

The LCD may not self-emit light. Accordingly, a light emitting device for illuminating a liquid crystal panel may be used to display image information.

The light emitting device of the LCD may be coupled to a bottom of the liquid crystal panel. Accordingly, the light emitting device of the LCD may be called a back light unit. The back light unit may form a uniform planar light source for emitting light to the liquid crystal panel.

The back light unit may include a light source, a light guide plate, a diffusion sheet, a prism, and/or a protection sheet. A fluorescent lamp, such as a cold cathode fluorescent lamp (CCFL), and/or a light emitting diode may be used as the light source.

BRIEF DESCRIPTION OF THE DRAWINGS

Arrangements and embodiments may be described in detail with reference to the following drawings in which like reference numerals refer to like elements and wherein.

DETAILED DESCRIPTION

Reference may now be made in detail to embodiments of the present disclosure, examples of which may be illustrated in the accompanying drawings.

A light emitting diode may serve as a radiation or a light source when forward current flows through a PN junction diode of a compound semiconductor. Considering a radiation principle of the light emitting diode, when a positive pole is connected to a P-side of the PN junction diode and a negative pole is connected to an N-side of the PN junction diode, holes on the P-side may move to the N-side and electrons on the N-side may move to the P-side, causing bonding of electrons and holes at a PN junction and forming photons to generate light.

Figure 1A:
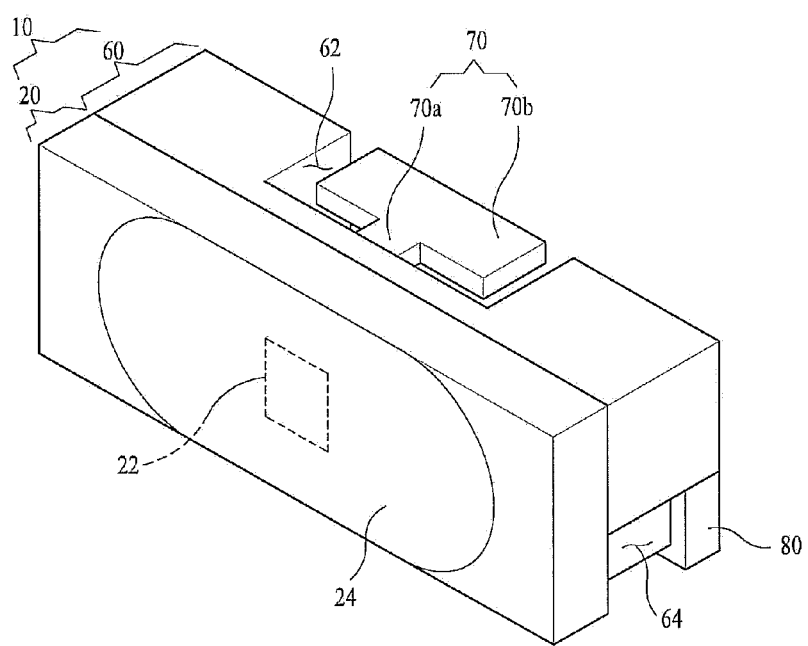
FIGS. 1A and 1B are perspective views illustrating a light emitting diode package according to an exemplary embodiment of the present disclosure.
Figure 1B:
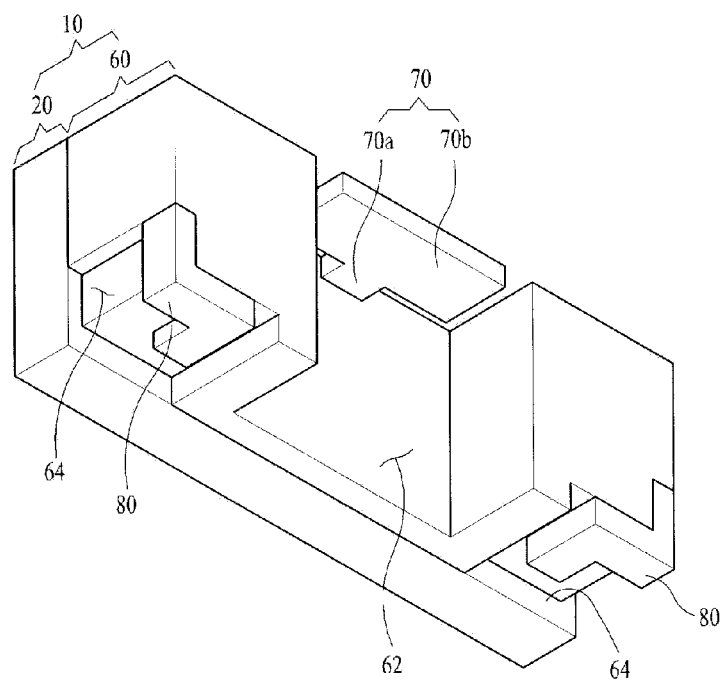

FIGS. 1A and 1B are perspective views illustrating a light emitting diode package according to an exemplary embodiment of the present disclosure. FIGS. 2A to 2E are a front view, a rear view, a side view, a plan view, and a bottom view, respectively, illustrating a light emitting diode package according to an exemplary embodiment of the present disclosure. Other embodiments and configurations may also be within the scope of the present disclosure.

A body 10 of the light emitting diode package may include a head part 20 and a body part 60. Although the head part 20 and the body part 60 may be individually prefabricated and attached to each other, according to design parameters, the head part 20 and the body part 60 may be integrally formed with each other to construct the body 10. The body 10 may be provided with at least one heat sink 70. The heat sink 70 may be mounted or provided in the body 10 (or on the body 10)

such that an outer surface of the heat sink 70 is located in a same plane as an outer surface of the body 10.

The head part 20 may include a top surface and a light emitting diode chip on a side surface. A top surface of the heat sink 70 and the top surface of the head part 20 may be on a common place.

The head part 20 may include a light emitting plane 24 defined at a surface thereof, in which the at least one light emitting diode chip 22 is mounted. The light emitting plane 24 may be coated with fluorescent substance. The fluorescent substance may serve to convert light emitted from the light emitting diode chip 22 into light of a different color.

The light emitting diode chip 22 may be selected from among various types of chips, such as a horizontal light emitting diode, a vertical light emitting diode, a flip-chip type light emitting diode, etc. The light emitting diode chip 22 may emit light having a wavelength of 430 nm to 480 nm.

The light emitting diode chip 22 may be die-bonded to a die pad by use of a die adhesive, or may be electrically connected to a lead pad by use of a gold wire. A reflector may be formed around the light emitting diode chip 22 to reflect light emitted from the light emitting diode chip 22 to improve luminescence efficiency.

The body part 60 may be attached to the head part 20 at an opposite side of the light emitting plane 24. The body 10 may be formed with one or more recesses 62 and 64. More specifically, the body part 60 may be formed with a first recess 62 to accommodate the heat sink 70.

The first recess 62 may be formed in a central region of the body 10 so as to be opened in opposite directions. The first recess 62 may expose the heat sink 70 to the outside so as to facilitate radiation of heat from an interior of the body 10.

The heat sink 70 may be connected to the light emitting diode chip 22 so as to enable heat transfer and may be exposed to the outside of the body 10. The heat sink 70 may be accommodated in the first recess 62 so as not to protrude out of the first recess 62.

The heat sink 70 may also be electrically connected to the light emitting diode chip 22 and may provide the light emitting diode chip 22 with a positive charge or a negative charge (or a positive voltage or a negative voltage). When the heat sink 70 is electrically connected to the light emitting diode chip 22 and is exposed to the outside of the body 10, the heat sink 70 may be electrically connected to an external electrode, thereby serving as a lead terminal.

The heat sink 70 may be electrically connected to the light emitting diode chip 22 and similar to a lead terminal, may be electrically connected to an external electrode. In this case, the body 10 may not be provided with a separate lead terminal.

As a result of the heat sink 70 functioning as a lead terminal and a heat radiator, a reduced thermal resistance may be accomplished even if a plurality of chips are used.

Alternatively, the body 10 may be provided with lead terminals 80 in addition to the heat sink 70. The body 10 may be formed with a plurality of second recesses 64 to accommodate the lead terminals 80. The second recesses 64 may be indented along opposite corners (or opposite sides) of the body 10 and have a shape to correspond to the lead terminals 80.

Each of the lead terminals 80 may be electrically connected to the light emitting diode chip 22 mounted in the body 10 and may be exposed to the outside. An outer surface of the lead terminal 80 may be located in a same plane as an outer surface of the body 10. This may prevent the lead terminal 80 from protruding from the outer surface of the body 10 and thus prevent the lead terminal 80 from occupying an excess space.

The lead terminal 80 may be accommodated in one of the second recesses 64 so as not to protrude out of the second recess 64 of the body part 60. The lead terminal 80 may be formed at and supported by an edge region of the body part 60 and may be electrically connected to an external electrode.

The lead terminal 80 may include a positive lead terminal and a negative lead terminal that are spaced apart from each other to provide the light emitting diode chip 22 with a positive charge or a negative charge (or a positive voltage or a negative voltage).

Figure 3:
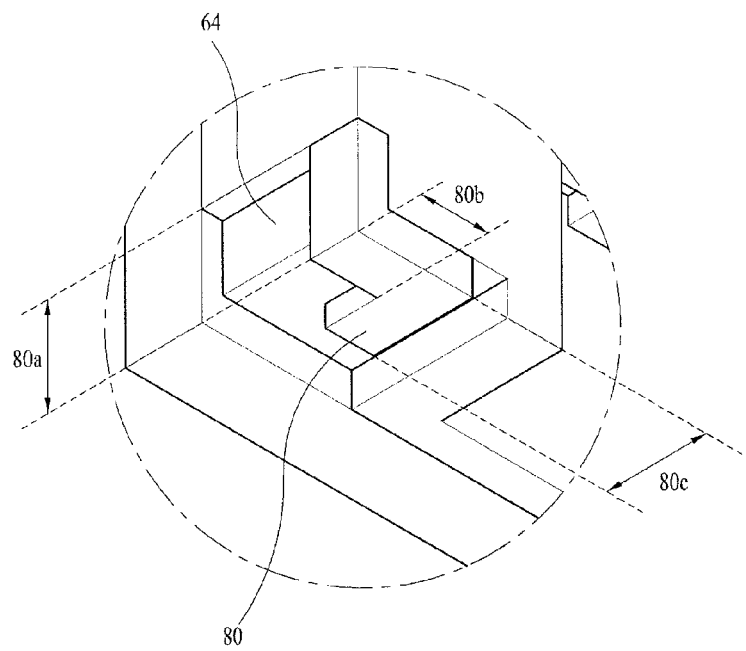
FIG. 3 is a partial perspective view illustrating a lead terminal according to an exemplary embodiment.

FIG. 3 is a partial perspective view illustrating a lead terminal according to an exemplary embodiment of the present disclosure. Other embodiments and configurations may also be within the scope of the present disclosure.

The lead terminal 80 may include a first segment 80a, a second segment 80b and a third segment 80c. The first segment 80a may be electrically connected to the light emitting diode chip 22 and may be seated in the second recess 64 of the body 10 to define a part of an outer side surface of the body part 60. The second segment 80b may be bent orthogonally from a distal end of the first segment 80a toward the center of the body part 60 and may define a corner of the body part 60 together with the first segment 80a. The third segment 80c may be bent orthogonally from a distal end of the second segment 80b toward the light emitting plane 24 of the head part 20 and may be located in a same plane as the second segment 80b.

The heat sink 70 may be electrically connected to the positive lead terminal or the negative lead terminal. The heat sink 70 may include a first heat sink electrically connected to the positive lead terminal, and a second heat sink electrically connected to the negative lead terminal. The first heat sink and the second heat sink may be located at opposite surfaces of the body 10 (see FIG. 5).

To prevent the lead terminal 80 from protruding from an outer surface of the head part 20, the second recess 64 to accommodate the lead terminal 80 may be formed at an edge region of the body part 60.

Accordingly, the lead terminal 80 may be accommodated in the second recess 64 so as not to protrude out of the second recess 64. The outer surface of the lead terminal 80 and the outer surface of the head part 20 may be located in a same plane.

One reason for preventing the lead terminal 80 and the heat sink 70 from protruding out of the recesses 64 and 62 may be to eliminate an unnecessary space for the resulting protrusion and to achieve stable alignment and assembly of the light emitting diode package when the body 10 is applied to a backlight unit, thereby realizing a slim configuration of the backlight unit.

When the outer surface of the body 10 is not provided with a protrusion, there may occur substantially no loss of light emitted from the light emitting plane 24 of the body 10 due to unnecessary space, and this may result in enhanced light incidence efficiency with respect to a light guide plate of a backlight unit.

The second recess 64 of the body part 60 may be deeper than the first recess 62.

Figure 2A:
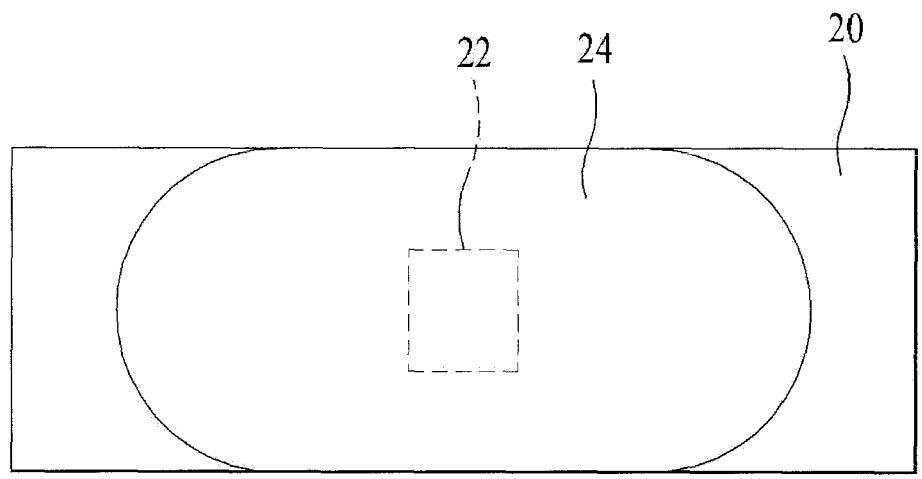
FIGS. 2A to 2E are a front view, a rear view, a side view, a plan view, and a bottom view, respectively, illustrating a light emitting diode package according to an exemplary embodiment.
Figure 2B:
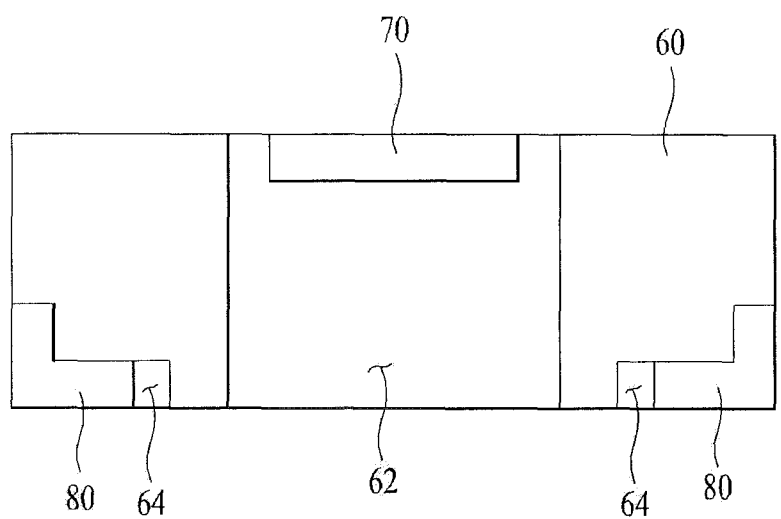
Figure 2C:
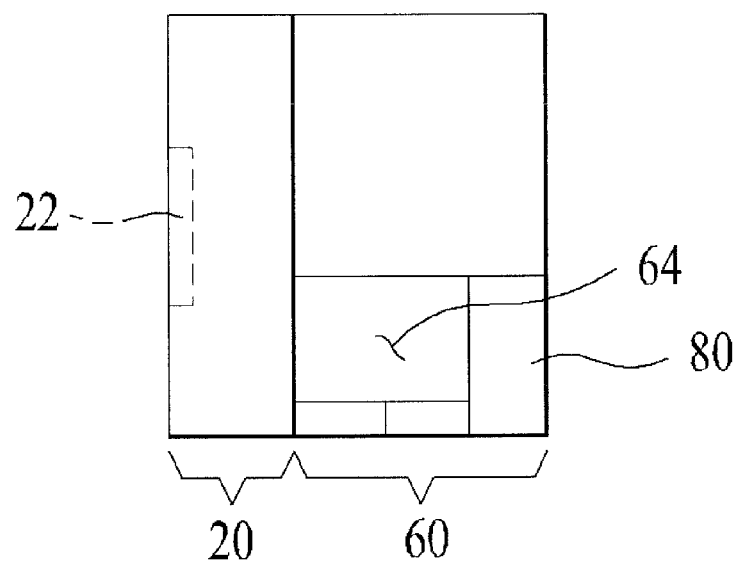
Figure 2D:
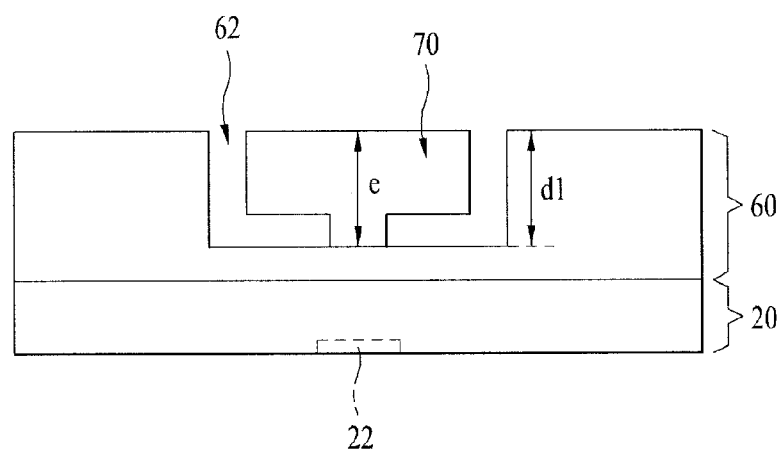
Figure 2E:
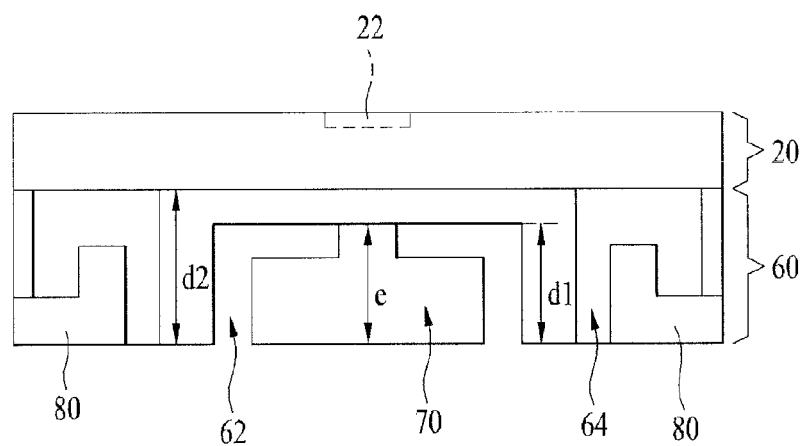

As shown in FIGS. 2D and 2E, the first recess 62 may be indented from an outer surface of the body part 60 opposite to an adhesive surface thereof toward the light emitting plane 24 of the head part 20 and a depth d1 of the first recess 62 may correspond to a distance from the outer surface of the body part 60 to a bottom surface of the first recess 62. The depth d1 of the first recess 62 may be equal to or greater than a height e of the heat sink 70.

The first recess 62 may be formed in the body part 61 such that top and bottom sides thereof corresponding to upper and lower surfaces of the body part 60 may be opened and opposite lateral sides thereof may be blocked. One reason for providing the first recess 62 with the open top and bottom sides may be to facilitate easy radiation of heat upward and downward of the heat sink 70. Maximizing an area of the heat sink 70 to be exposed to outside air may enhance radiation efficiency of the heat sink 70.

The second recess 64 may be indented from the outer surface of the body part 60 opposite to the adhesive surface thereof toward the light emitting plane 24 of the head part 20 and a depth d2 of the second recess 64 may correspond to a distance from the outer surface to the adhesive surface of the body part 60. The depth d2 of the second recess 64 may be greater than the depth d1 of the first recess 62.

One reason why the depth d2 of the second recess 64 is greater than the depth d1 of the first recess 62 may be to construct the body part 60 in the form of an integral body. When the body part 60 is divided into a plurality of pieces, the body part 60 may have difficulty stably supporting the head part 20.

Since the second recess 64, in which the lead terminal 80 is accommodated, is formed in the edge region of the body part 60, the second recess 64 may substantially have no effect on other configurations even if it occupies a wide space. However, if the first recess 62, which is formed in the central region of the body part 60, has the same depth d2 as the second recess 64, it may cause division of the body part 60, making it difficult for the body part 60 to support the head part 20.

The second recess 64 may be formed in the body part 60 such that a bottom side and one lateral side thereof corresponding to the lower surface and side surface of the body part 60 are open and a top side and the other lateral side thereof are blocked. An upper surface of the head part 20 and the upper surface of the body part 60 may be located in a same plane.

A lower surface of the head part 20 and an edge region of the lower surface of the body part 60 may be located in different planes, whereas the lower surface of the head part 20 and the central region of the lower surface of the body part 60 may be located in a same plane.

Figure 4:
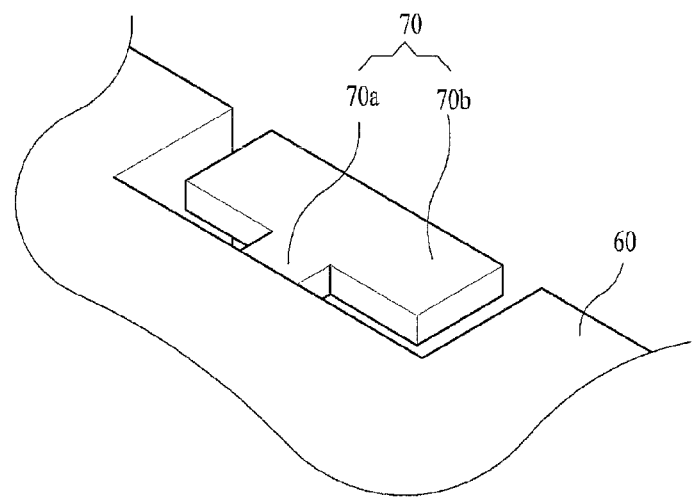
FIG. 4 is a partial perspective view illustrating a heat sink according to an exemplary embodiment.

FIG. 4 is a partial perspective view illustrating a heat sink according to an exemplary embodiment of the present disclosure. Other embodiments and configurations may also be within the scope of the present disclosure.

The heat sink 70 may be divided into a connecting portion 70a and a radiating portion 70b. The connecting portion 70a may be electrically connected to the light emitting diode chip 22, and may be located at and supported by the central region of the body part 60. The radiating portion 70b may be connected to a distal end of the connecting portion 70a and may be exposed to the outside so as to radiate heat generated from the light emitting diode chip 22 to the outside.

An upper surface of the heat sink 70 may be located in a same plane as the upper surfaces of the head part 20 and the body part 60.

Figure 5:
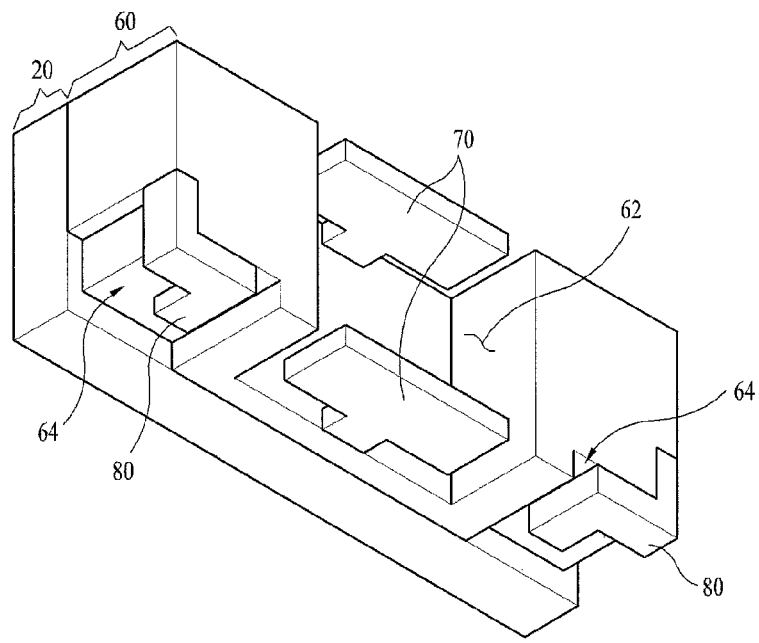
FIG. 5 is a perspective view illustrating a heat sink according to an exemplary embodiment of the present disclosure.

FIG. 5 is a perspective view illustrating a heat sink according to an exemplary embodiment of the present disclosure. Other embodiments and configurations may also be within the scope of the present disclosure.

The body 10 may be provided with a plurality of heat sinks 70. The plurality of heat sinks 70 may be formed at and supported by the central region of the body part 60, and may be spaced apart from one another by a predetermined distance.

Another embodiment of the light emitting diode package may now be described in detail. The present embodiment may have a difference, e.g., in configuration of the first recess formed in the body part 60. A description of the same constituent elements as those of the previously described embodiment may be omitted.

Figure 6:
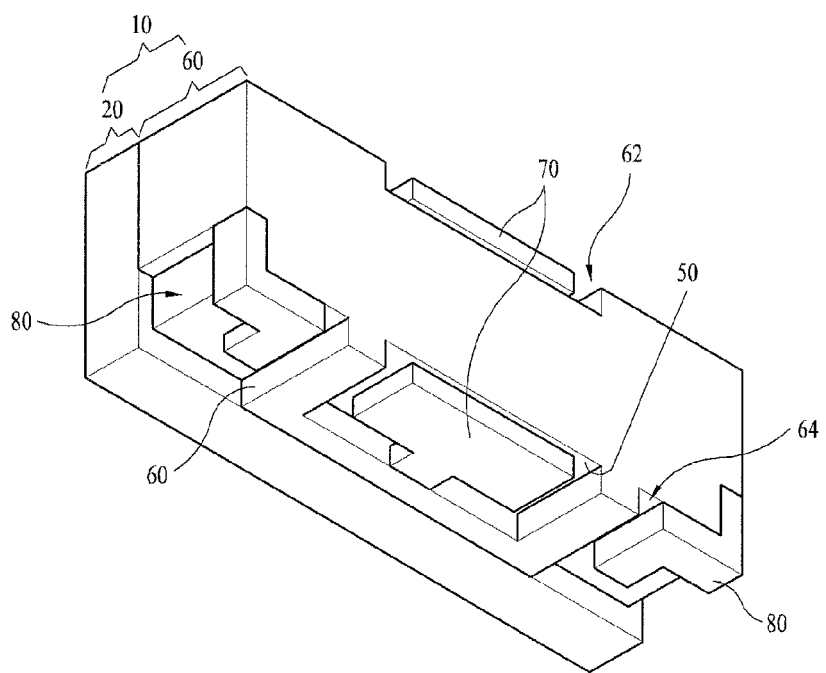
FIG. 6 is a perspective view illustrating a light emitting diode package according to an exemplary embodiment of the present disclosure.

FIG. 6 is a perspective view illustrating a light emitting diode package according to an exemplary embodiment of the present disclosure. Other embodiments and configurations may also be within the scope of the present disclosure.

The body part 60 may have an approximately cuboid shape. The body part 60 may include a pair of first recesses 62 to accommodate the heat sinks 70 and a pair of second recesses 64 to accommodate the lead terminals 80, the first recesses 62 may be indented, respectively, from opposite upper and lower surfaces of the body part 60, and the second recesses 64 may be formed in edge regions of the surface of the body part 60 opposite to the adhesive surface thereof.

In this embodiment, the pair of first recesses 62 may be formed in the central region of the body part 60 so as to be opened in opposite directions. More specifically, the first recesses 62 may be indented by a predetermined depth from the upper and lower surfaces of the body part 60, providing spaces for accommodation of the heat sinks 70. An indented depth of the first recess 62 may be greater than a thickness of the heat sink 70, to prevent the heat sink 70 accommodated in the first recess 62 from protruding from the outer surface of the body part 60.

The following Table 1 shows performance comparison results between other arrangements and a light emitting diode package of an exemplary embodiment of the present disclosure.

TABLE 1

| | Other Arrangements | | Example Embodiment | |
|---|---|---|---|---|
| Thermal Resistance (Ti & Rth @ 25° C.) | 41.8° C./263(° C./W) | | 46.6° C./112.1(° C./W) | |
| Drop Rate of luminosity 1,000 hr 4,000 hr | @25° C. 20 mA | −2.78% −29.82% | @85° C. 64 mA | 3.02% −12.16% |
| Lifespan | <15,000 hr | | >30,000 hr | |

As shown in Table 1, embodiments of the present disclosure may have a lower thermal resistance than other arrangements despite use of the plurality of light emitting diode chips.

In addition, in view of a drop rate of luminosity under acceleration conditions, embodiments may be considerably more efficient than other arrangements and also have considerably greater lifespan than the other arrangements.

Accordingly, with use of the separate heat sink in addition to an external lead terminal, embodiments may achieve rapid radiation of heat, enhanced lifespan, and may package the plurality of light emitting diode chips simultaneously, resulting in enhancements in light efficiency and radiation characteristics.

As a result of designing the lead terminal and the heat sink so as not to protrude out of the body of the light emitting diode package, embodiments may achieve enhanced light incidence efficiency to a light guide plate and may be applicable to a slim backlight unit.

An exemplary embodiment of a backlight unit and a display device including the light emitting diode package according to an example embodiment may now be described.

Figure 7:
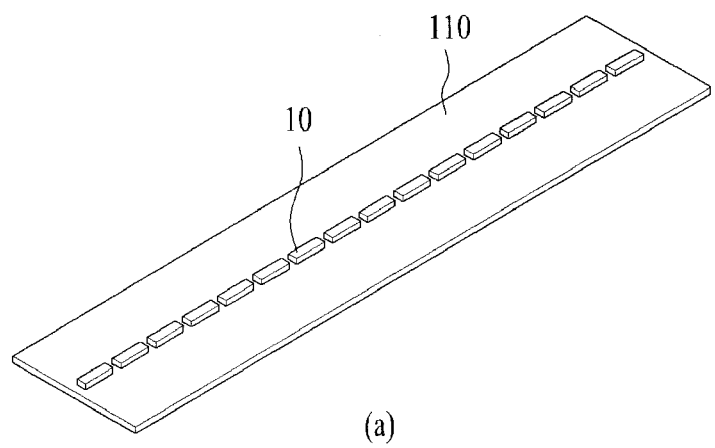
FIGS. 7(a) and 7(b) are perspective views illustrating a configuration of a circuit board according to an exemplary embodiment of the present disclosure.
Figure 7:
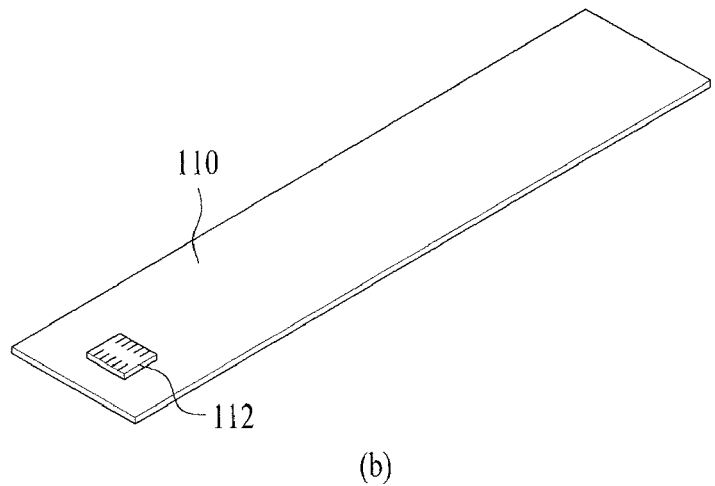

FIGS. 7(a) and 7(b) are perspective views illustrating a configuration of a circuit board according to an exemplary embodiment of the present disclosure.

A plurality of light emitting diode package bodies 10 may be provided on a circuit board 110, and for example, a connector 112 for power supply may be provided on a bottom of the circuit board 110 on a side opposite of the diode package bodies 10.

Figure 8:
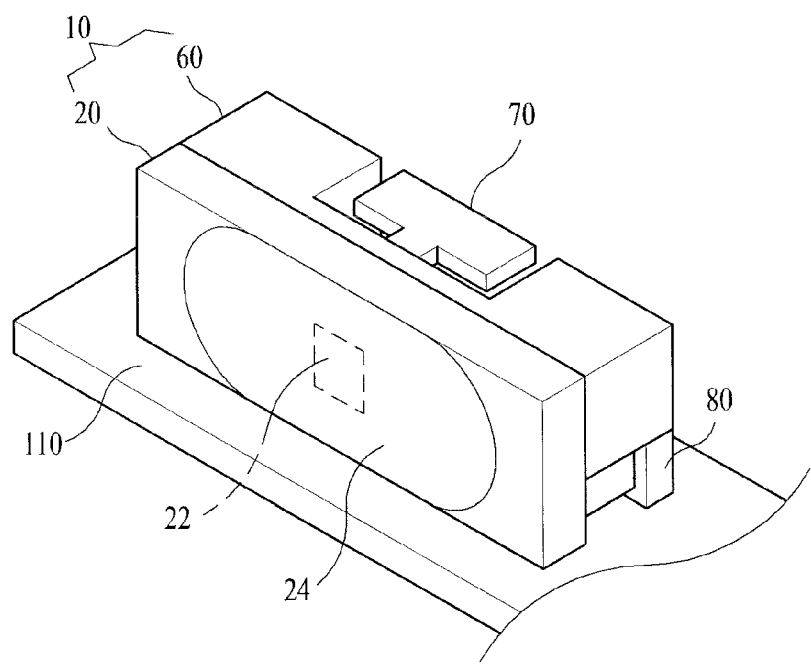
FIG. 8 is a perspective view illustrating a configuration of a side emission type light emitting diode package according to an exemplary embodiment of the present disclosure.
Figure 9:
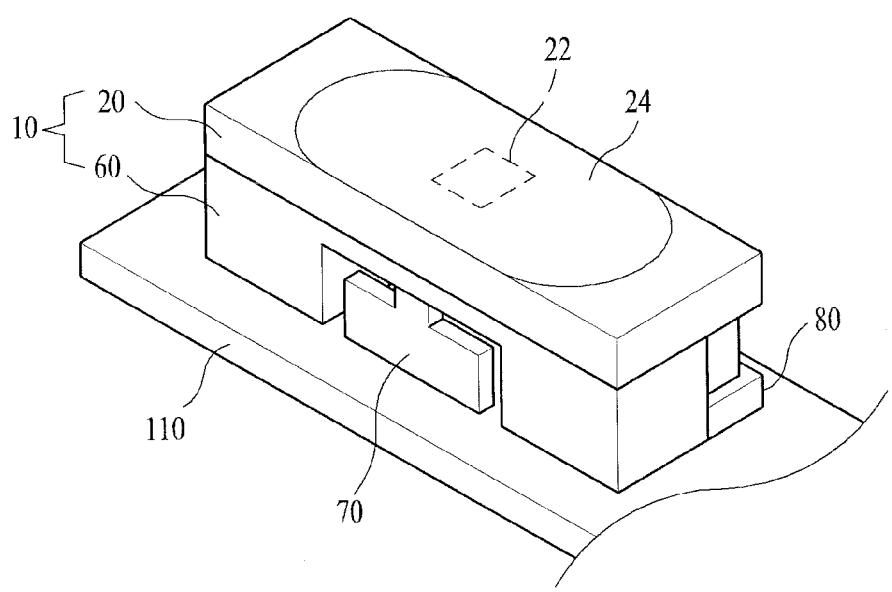
FIG. 9 is a perspective view illustrating a configuration of a top emission type light emitting diode package according to an exemplary embodiment of the present disclosure.

FIGS. 8 and 9 are views illustrating a state in which light emitting diode packages are oriented in different directions on a circuit board according to an exemplary embodiment of the present disclosure.

More specifically, FIG. 8 illustrates a side emission type light emitting diode package in which the light emitting diode chip 22 is provided at a surface of the body 10 orthogonal to the circuit board 110, and FIG. 9 illustrates a top emission type light emitting diode package in which the light emitting diode chip 22 is provided at a surface of the body parallel to the circuit board 110.

As described above, the body 10 of the light emitting diode package may define a side emission type light emitting diode package or a top emission type light emitting diode package according to an orientation of the light emitting diode chip 22 relative to the circuit board 110.

Figure 10:
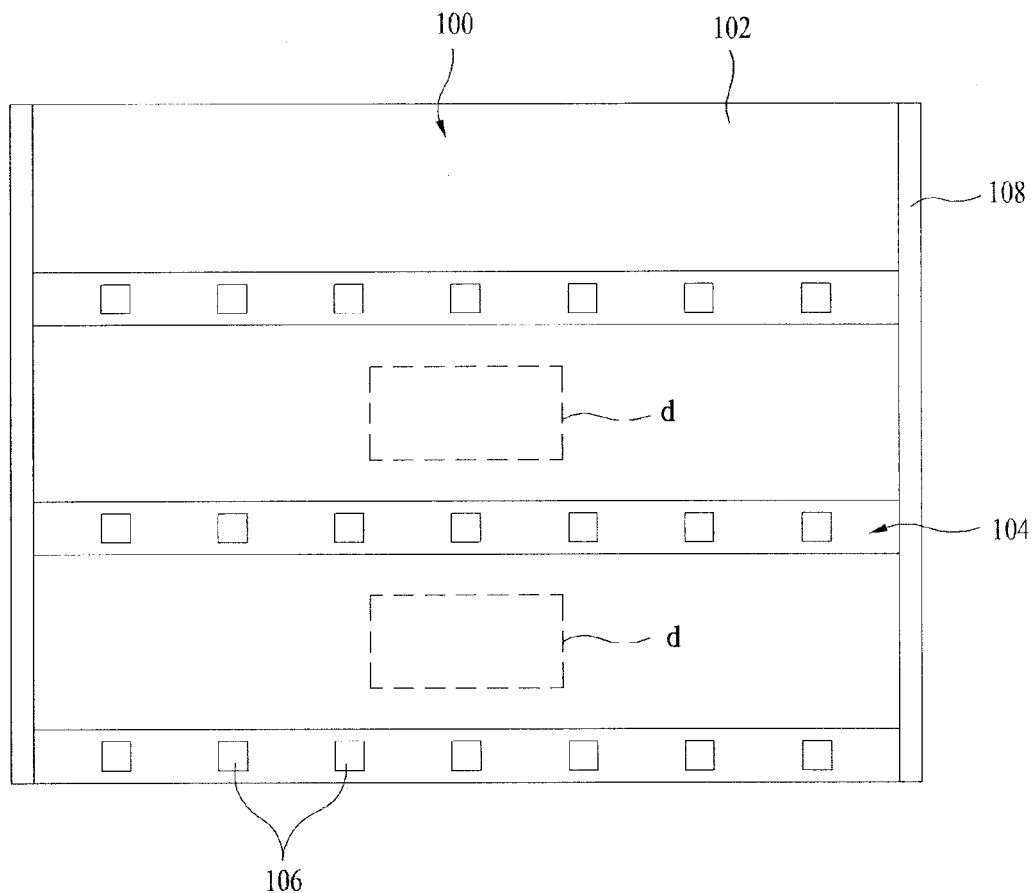
FIG. 10 is a plan view illustrating a frame of a backlight unit according to an exemplary embodiment of the present disclosure.
Figure 11:
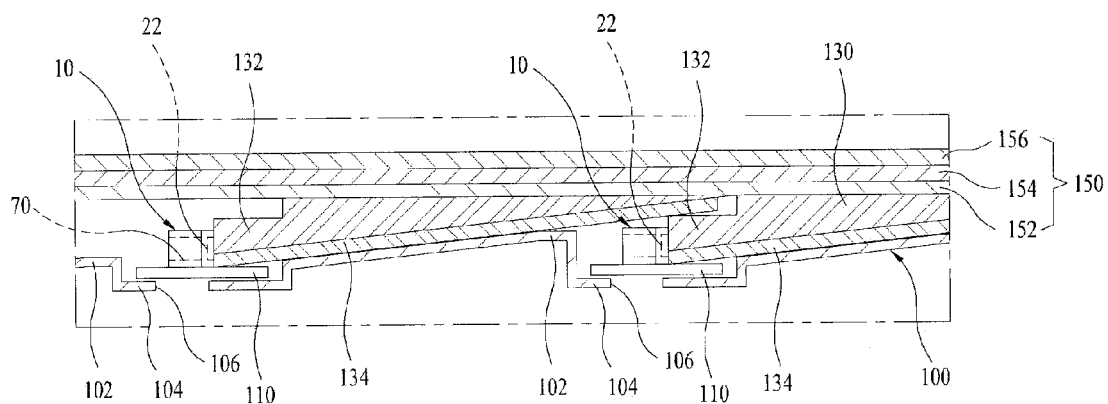
FIG. 11 is a sectional view illustrating a backlight unit according to an exemplary embodiment of the present disclosure.

FIG. 10 is a view illustrating a frame of a backlight unit according to an exemplary embodiment of the present disclosure, and FIG. 11 is a sectional view illustrating a backlight unit according to an exemplary embodiment of the present disclosure. Other embodiments and configurations may also be within the scope of the present disclosure.

The backlight unit may include a frame 100 having holes 106 vertically perforated therein, circuit boards 110 arranged on the frame 100 to correspond to the respective holes 106, a light emitting diode package body 10 (hereafter referred to as a "body") provided on each of the circuit boards 110, and a light guide plate 130 to distribute light transmitted from the body 10. The body 10 provided with the light emitting diode chip 22 may emit light and the heat sink 70 connected to the light emitting diode chip 22 may enable heat transfer as well as radiation of heat.

The body 10 may include the head part 20 having the light emitting plane 24 in which the light emitting diode chip 22 is mounted, and the body part 60 whose the adhesive surface is attached to a surface of the head part 20 opposite to the light emitting plane 24 thereof. The body part 60 may be provided with the heat sink 70, and the lead terminal 80 may be electrically connected to the light emitting diode chip 22 and may be supported at the edge region of the body part 60.

The circuit board 110 on which the body 10 is provided may be installed on the frame 100. The frame 100 may have a shape corresponding to a plurality of light guide plates 130. The frame 100 may include a bottom plate 102 on which, for example, the circuit boards 110 and the light guide plates 130 are seated, and surface plates 108 to support side edges of the light guide plates 130, for example.

The bottom plate 102 may have an approximately flat plate shape. Recessed portions 104 may be formed in the bottom plate 102. The circuit boards 110 may be respectively seated in the recessed portions 104.

The recessed portions 104 may extend parallel to a side surface of the frame 100. More specifically, the plurality of recessed portions 104 may be arranged to correspond, respectively, to the plurality of light guide plates 130, and each single recessed portion 104 may be provided with the plurality of circuit boards 100 corresponding to a length thereof.

The recessed portion 104 may be formed with the holes 106 to expose the circuit boards 110 to the outside. The recessed portion 104 may be bent orthogonally from the bottom plate 102 to define a step portion (or a raised portion) with a main plane of the bottom plate 102. The circuit boards 110 may be arranged on the recessed portion 104 to correspond to the respective holes 106.

The heat sink 70 may come into contact with the circuit board 110 so as to enable heat transfer. This may allow heat of the heat sink 70 to be radiated to the holes 106 and the frame 100 through the circuit boards 110. More specifically, the heat sink 70, which may be provided at the bottom of the body part 60 to face an upper surface of the circuit board 110, may transfer heat to the circuit board 110 and in turn, the circuit board 110 may radiate heat through the frame 100 and the holes 106 that come into contact with a lower surface of the circuit board 110.

The body 10 may be provided on the circuit board 110 and may include the light emitting plane 24 in which yellow fluorescent substance is coated over the blue light emitting diode chip 22 that serves to emit light having a wavelength of 430 nm to 480 nm, and a plurality of the lead terminals 80.

The circuit boards 110 may be electrically connected to a drive unit d via the holes 106 formed in the bottom plate 102. The drive unit d may be provided at a lower surface of the bottom plate 102.

Figure 12:
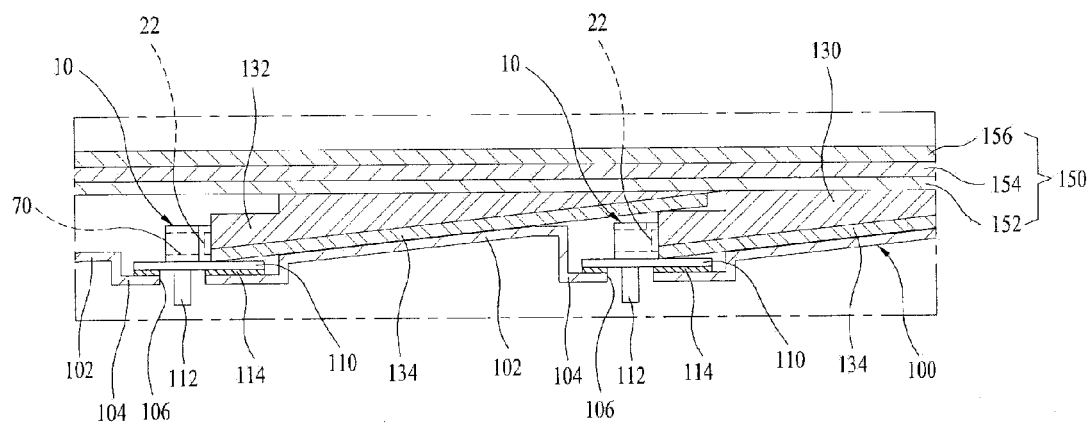
FIG. 12 is a sectional view illustrating a backlight unit according to an exemplary embodiment of the present disclosure.

FIG. 12 is a sectional view illustrating a backlight unit according to an exemplary embodiment of the present disclosure. Other embodiments and configurations may also be within the scope of the present disclosure.

The circuit board 110 may be provided with a connector 112. The connector 112 may be connected to a drive unit d that supplies power to the circuit board 110.

The connector 112 may protrude from the lower surface of the circuit board 110. The connector 112 may be positioned to correspond to the hole 106 formed in the bottom plate 102. More specifically, the connector 112 may protrude downward of the frame 100 by penetrating through the hole 106 of the bottom plate 102 and may be connected to the drive unit d so as to supply power to the circuit board 110.

A radiation pad 114 may be provided between the circuit board 110 and the frame 100. The radiation pad 114 may be attached to the lower surface of the circuit board 110. The radiation pad 114 may be made of a heat-resistant, insulative, nontoxic material and may transfer heat generated from the circuit board 110 to the frame 100. More specifically, the radiation pad 114 may be provided between the recessed portion 104 of the bottom plate 102 and the circuit board 110, and a specific portion of the radiation pad 114 corresponding to the hole 106 formed in the bottom plate 102 may be exposed to the outside. That is, the specific portion of the radiation pad 114 corresponding to the hole 106 may have open upper and lower surfaces.

The light guide plate 130 may include a light incidence portion 132 and a light emitting portion, and may undergo uniform distribution and reflection of light therein.

An outer main plane of the light guide plate 130 may define a light emitting plane. As a plurality of the light guide plates 130 are connected to one another, the light emitting portions of the light guide plates 130 may be successively repeated by a predetermined length, enabling creation of a light emitting plane of a large-scale screen.

According to design parameters, light guide plates 130 of different sizes may be arranged. In this case, repeated lengths of the light guide plates 130 may be different from each other.

A thickness of each of the light guide plates 130 may be reduced with an increasing distance from the light incidence portion 132. A lower surface of the light guide plate 130 may be inclined in a given direction such that the thickness of the light guide plate 130 is gradually reduced with an increasing distance from the light incidence portion 132.

The light incidence portion 132 of the light guide plate 130 may serve as a light incidence portion and may be shaped to protrude toward a light source. An upper surface of the light incidence portion 132 may be positioned lower than a light emitting plane of the light guide plate 130. Protruding of the light incidence portion 132 lengthily in a given direction from the light guide plate 130 may eliminate (or reduce) any dark region due to gaps between light sources and may also prevent (or reduce) direct light leakage through seams of the light guide plates 130.

The plurality of light guide plates 130 may be arranged to define a single plane. The light incidence portion 132 provided at one end of the light guide plate 130 may partially overlap an opposite end of the neighboring light guide plate 130. More specifically, as one end of the light guide plate 130 covers an opposite end of the neighboring light guide plate 130 from the upper side, the plurality of light guide plates 130 may be formed in a single plane as the light emitting plane.

A reflective layer 134 may be provided between the frame 100 and the light guide plate 130. Alternatively, according to design parameters, instead of the reflective layer 134, the frame 100 may be made of a reflective material, such as a metal. The reflective layer 134 may be provided under the light guide plate 130, or may be provided, as a separate layer, between the light guide plate 130 and the frame 100.

The backlight unit may further include a plurality of optical sheets 150 for controlling luminance characteristics of light emitted from the backlight unit.

The optical sheets 150 may be located at a rear side of a liquid crystal panel 200 as shown in FIG. 11, and may include a diffusion sheet 152, a prism sheet 154 and a protective sheet 156.

The diffusion sheet 152 may serve to diffuse light from the backlight unit so as to supply the diffused light to the liquid crystal panel 200. The prism sheet 154 may have a micro-prism array formed at an upper surface thereof and may serve to condense the diffused light from the diffusion sheet 152 in a direction perpendicular to a plane of the liquid crystal panel 200 thereabove.

Micro-prisms formed at the prism sheet 154 may define a predetermined angle with one another. Most light having passed through the prism sheet 154 may be directed vertically, providing uniform luminance distribution. The protective sheet 156 as the uppermost layer may serve to protect the prism sheet 154 from scratches.

Figure 13:
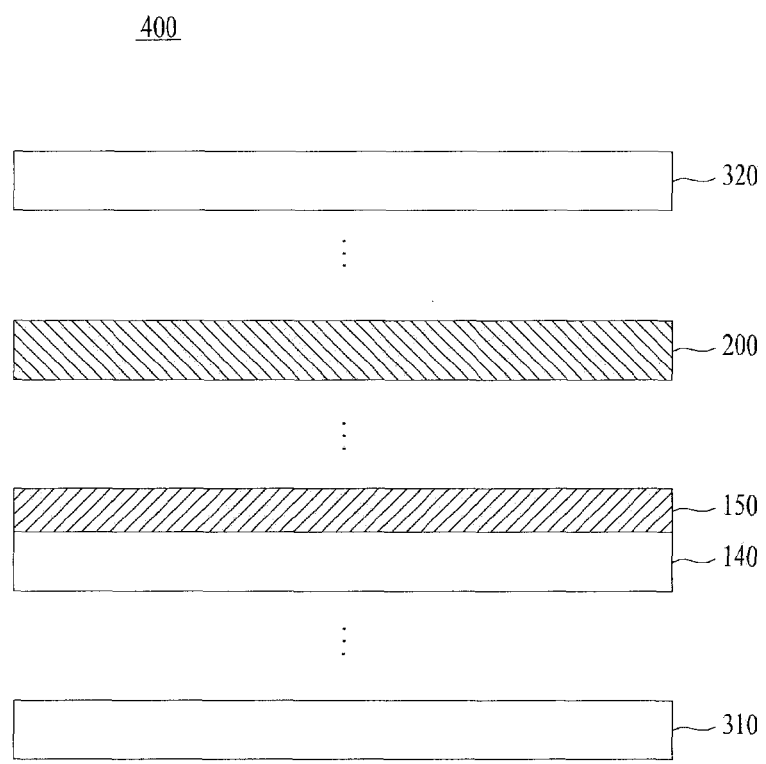
FIG. 13 is an exploded view illustrating a display device according to an exemplary embodiment of the present disclosure.

FIG. 13 is an exploded view illustrating a display device according to an exemplary embodiment of the present disclosure. Other embodiments and configurations may also be within the scope of the present disclosure.

A display device 400 may include the liquid crystal panel 200 arranged on the above described backlight unit (hereafter designated by reference numeral 140). The display device 400 may include a power source unit (not shown) for providing power required to start and drive the backlight unit 140. The power source unit may be connected to an external power source.

The liquid crystal panel 200 located above the backlight unit 140 may include a liquid crystal layer (not shown) injected between upper and lower circuit boards (not shown) facing each other. A drive unit d for driving the liquid crystal panel 200 may be provided at one side of the liquid crystal panel 200.

A lower cover 310 for covering the backlight unit 140 may be provided at the bottom of the liquid crystal panel 200, and an upper cover 320 for covering a front surface of the liquid crystal panel 200 may be provided at the top of the liquid crystal panel 200.

The liquid crystal panel 200 may include liquid crystal cells that constitute pixels and are arranged in matrix. The light transmissivity of the liquid crystal cells may be adjusted according to image signal information from the drive unit d, realizing formation of an image.

The drive unit d may include a Flexible Printed Circuit Board (FPCB), drive chips mounted in the FPCB, and a Printed Circuit Board (PCB) connected to one side of the FPCB Another exemplary embodiment of the present disclosure may now be described in detail.

Figure 14:
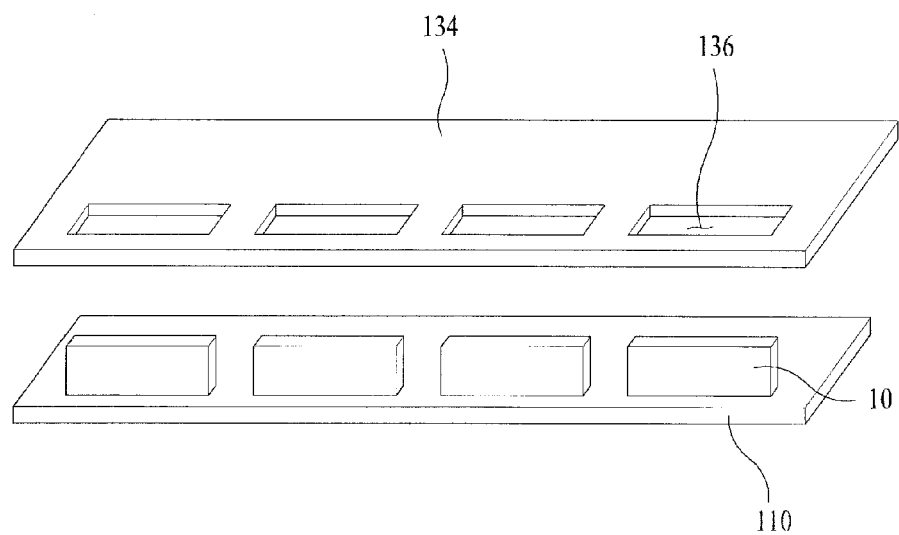
FIG. 14 is a perspective view illustrating a relationship of a circuit board and a reflective layer according to an exemplary embodiment of the present disclosure.
Figure 15:
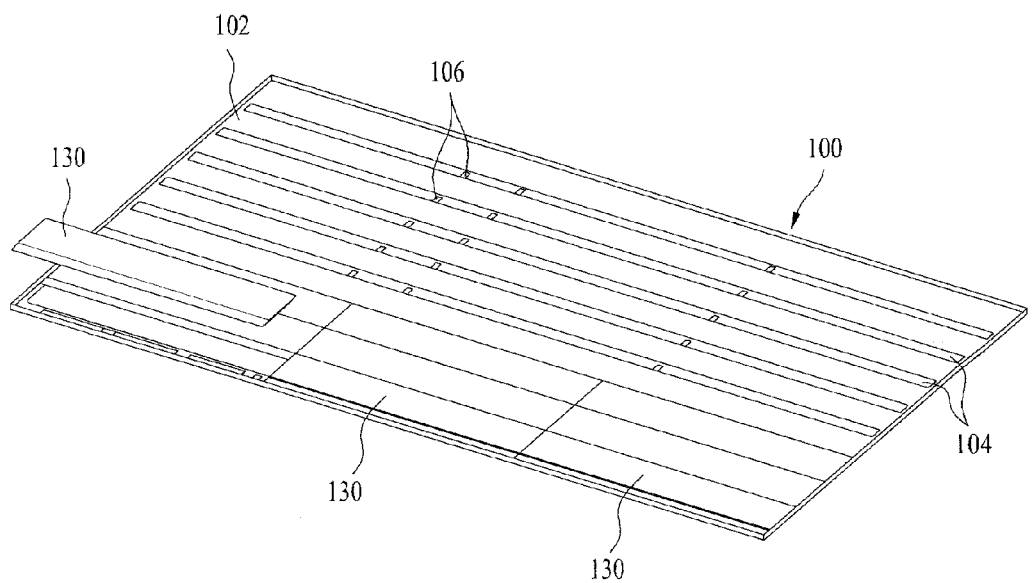
FIG. 15 is a perspective view illustrating a configuration of a backlight unit according to an exemplary embodiment of the present disclosure.
Figure 16:
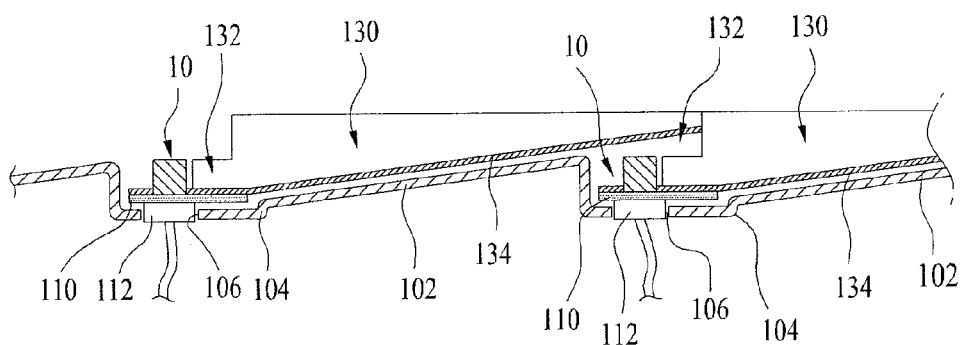
FIG. 16 is a view illustrating an arrangement relationship of a circuit board and a light guide plate mounted to a frame according to an exemplary embodiment of the present disclosure.

FIG. 14 is a perspective view illustrating a relationship of a circuit board and a reflective layer according to an exemplary embodiment of the present disclosure, FIG. 15 is a perspective view illustrating a configuration of a backlight unit according to an exemplary embodiment of the present disclosure, and FIG. 16 is a view illustrating a arrangement relationship of a circuit board and a light guide plate mounted to a frame according to an exemplary embodiment of the present disclosure.

In FIG. 14, the reflective layer 134 may have a plurality of through-holes 136. The through-holes 136 may correspond to the bodies 10 of the light emitting diode packages respectively. Each body 10 may penetrate through the corresponding through-hole 136 to protrude from a surface of the reflective layer 134, and the reflective layer 134 may be seated on the circuit board 110.

In FIG. 15, the frame 100, on which the plurality of light guide plates 130 and bodies 10 are provided, may take the form of a plate having an area corresponding to that of the liquid crystal panel 200. The frame 100 may include a bottom plate 102 corresponding to the light guide plates 130, and recessed portions 104 formed in the bottom plate 102. The circuit boards 110 may be respectively seated in the recessed portions 104.

The recessed portions 104 may extend parallel to a side surface of the frame 100. More specifically, the plurality of recessed portions 104 may be arranged to correspond, respectively, to the plurality of light guide plates 130, and each single recessed portion 104 may be provided with the plurality of circuit boards 100 corresponding to a length thereof.

The recessed portion 104 may be formed with the holes 106 to expose the circuit boards 110 to the outside. The recessed portion 104 may be bent orthogonally from a main plane of the bottom plate 102 to define a step portion (or a raised portion) with the main plane of the bottom plate 102. The frame may be provided with the drive unit d. The drive unit d is adapted to control various configurations using electric signals. In the exemplary embodiment, a backlight drive unit may be described by way of example. The backlight drive unit may control driving of the backlight unit 140 in linkage with the display panel 200.

The plurality of light guide plates 130 may be arranged in a neighboring state on the frame 100, defining a large-area light emitting surface. The plurality of light guide plates 130 are individually driven. The light guide plates 130 may define a uniform light emitting surface and may allow the bodies 10 of the light emitting diode packages to be partially driven according to an image, enabling local dimming.

In FIG. 16, the circuit boards 110 may be arranged on the recessed portion 104 of the frame 100, and the connectors 112 of the circuit board 110 may penetrate through the holes 106 of the frame 100 so as to be exposed downward from the frame 100. The connectors 112 may be electrically connected to the drive unit d provided around the frame 100.

The reflective layer 134 may be seated on the circuit board 110, and the body 10 of the light emitting diode package may be located on the circuit board 110 by penetrating through the reflective layer 134. The light guide plate 130 is provided on the frame 100 so that the light incidence portion 132 thereof faces the body 10 of the light emitting diode package. In this case, the plurality of light guide plates 130 may neighbor to one another so as to define a single plane, and the light incidence portion 132 provided at one end of the light guide plate 130 may partially overlap an opposite end of the neighboring light guide plate 130.

More specifically, as one end of the light guide plate 130 provided with the light incidence portion 132 covers the other end of the neighboring light guide plate 130, i.e. an opposite end of the neighboring light guide plate 130 from the upper side, the plurality of light guide plates 130 may be formed in a single plane as the light emitting plane. In this case, the light incidence portion 132 may be spaced apart from the body 10 of the light emitting diode package by a predetermined distance.

As described above, the body 10 of the light emitting diode package may be formed of a side emission type light emitting diode light source s or a top emission type light emitting diode light source u according to a configuration thereof, and this may enable various configurations of a backlight unit according to the configuration of the body 10 of the light emitting diode package.

Figure 17:
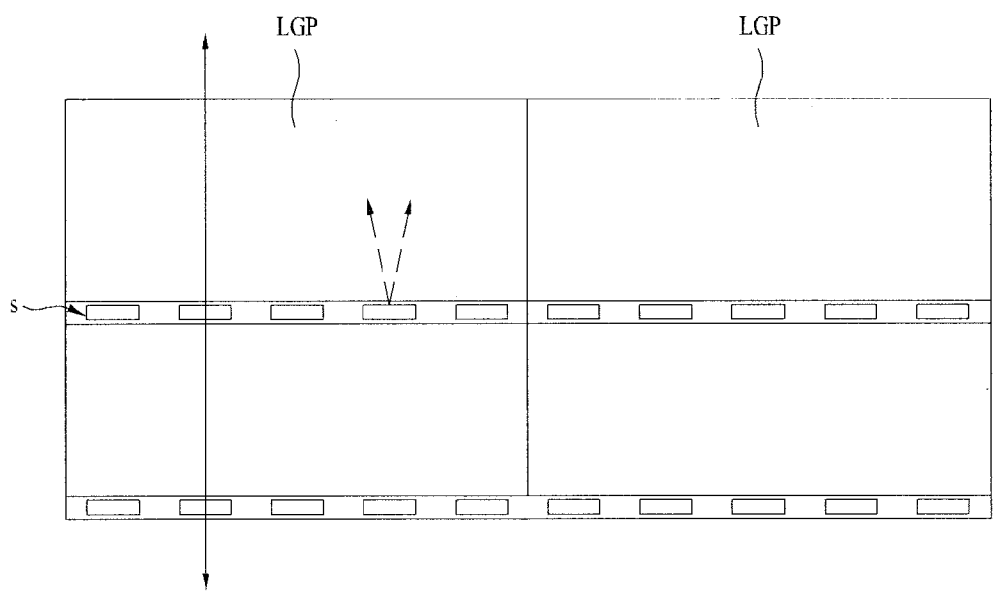
FIGS. 17(a) and 17(b) are views illustrating a backlight unit using side emission type light emitting diode light sources.
Figure 17:
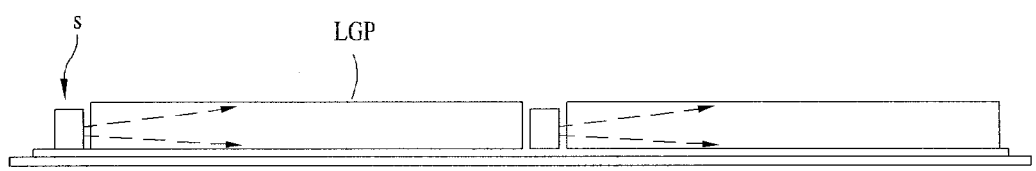
Figure 18:
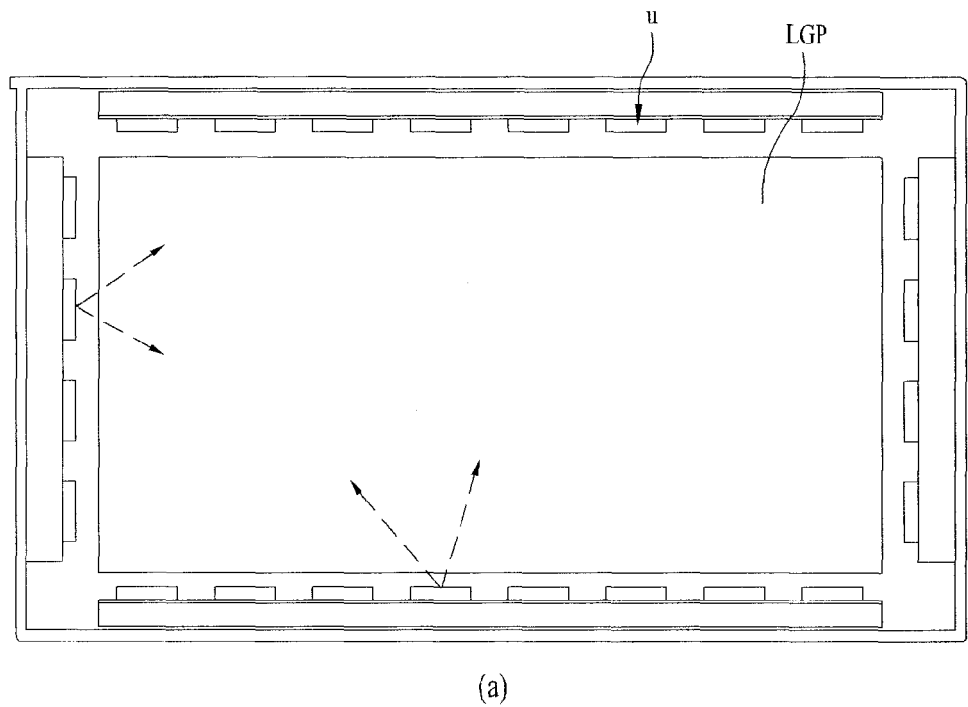
FIGS. 18(a) and 18(b) are views illustrating a backlight unit using top emission type light emitting diode light sources.
Figure 18:
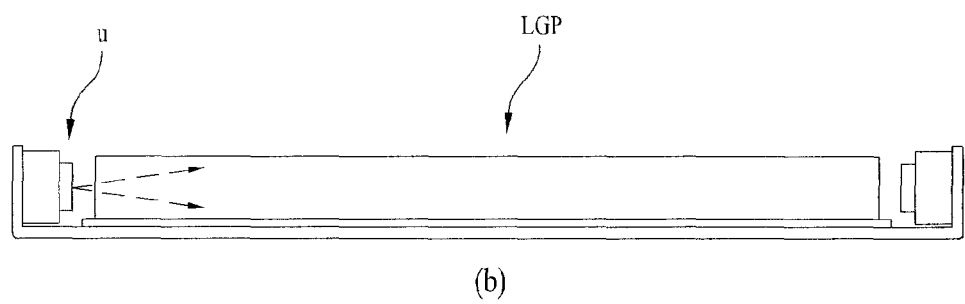

FIGS. 17(a) and 17(b) are views illustrating a backlight unit using side emission type light emitting diode light sources, and FIGS. 18(a) and 18(b) are views illustrating a backlight unit using top emission type light emitting diode light sources.

In FIGS. 17(a) and 17(b), side emission type light emitting diode light sources s may be arranged respectively between neighboring ones of a plurality of light guide plates, to irradiate light to the respective light guide plates.

In FIGS. 18(a) and 18(b), top emission type light emitting diode light sources u may be arranged along an edge of a single light guide plate, to irradiate light to the single light guide plate.

Figure 19:
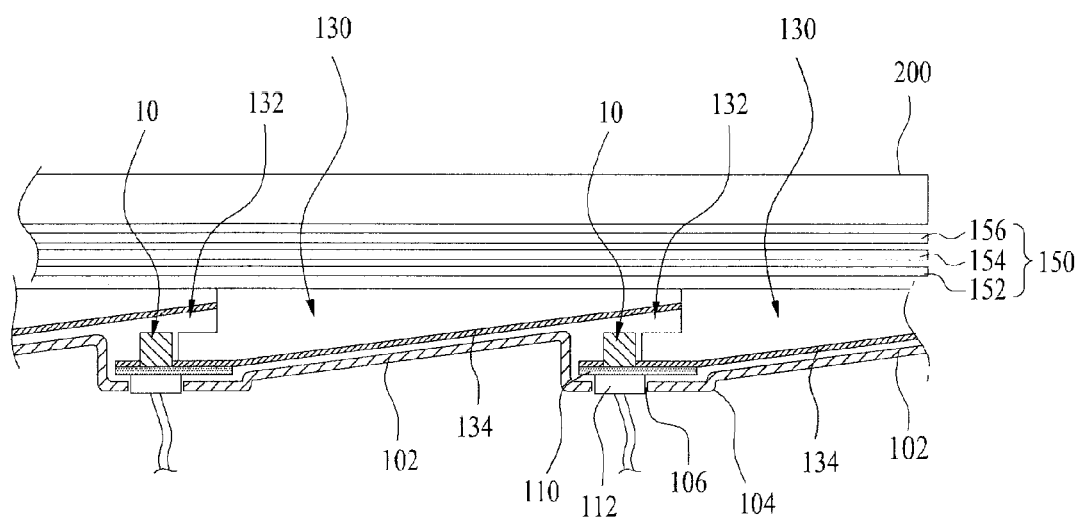
FIG. 19 is a view illustrating a relationship of a backlight unit and an optical sheet according to an exemplary embodiment of the present disclosure.

FIG. 19 is a view illustrating a relationship of a backlight unit and an optical sheet according to an exemplary embodiment of the present disclosure.

A plurality of optical sheets 150 may be provided on the backlight unit 140, to control brightness properties of light emitted from the light guide plate 130. The optical sheets 150 may be arranged on a bottom of the display panel 200, and may include a diffusion sheet 152, a prism sheet 154, and/or a protection sheet 156.

The diffusion sheet 152 may serve diffuse light emitted from the backlight unit and supply the diffused light to the display panel 200. The prism sheet 154 may have triangular micro prisms formed on the top thereof in a predetermined array. The prism sheet 154 may serve to condense light diffused by the diffusion sheet 152 in a direction perpendicular to a plane of the display panel 200.

The micro prisms formed on the prism sheet 154 may have a predetermined angle. Most of the light, having passed through the prism sheet 154, may advance perpendicularly to provide uniform brightness distribution. The uppermost protection sheet 156 may protect the prism sheet 154, which has low scratch resistance.

Embodiments of the present disclosure may solve problems by providing a light emitting diode package in which a heat sink is provided for radiation of heat generated from a light emitting diode, resulting in enhanced lifespan of a light emitting diode chip.

Embodiments of the present disclosure may include a light emitting diode package in which a heat sink provided for radiation of heat may be used as an external lead terminal, allowing a plurality of light emitting diode chips to be packaged simultaneously and resulting in enhancements in light efficiency and radiation characteristics.

Embodiments of the present disclosure may include a light emitting diode package in which a lead terminal is configured so as not to protrude out of the package, resulting in enhanced light incidence efficiency to a light guide plate.

Embodiments of the present disclosure may provide a light emitting diode package including a body including a light emitting diode chip for emitting light having a wavelength of 430 nm to 480 nm and a light emitting plane coated with fluorescent substance to convert the light emitted from the light emitting diode chip into light of a different color. The light emitting diode package may also include at least one heat sink provided at the body (or on the body).

A backlight unit may include a frame having at least one hole, a circuit board arranged on the frame, a light emitting diode package arranged on the circuit board (and having a body having a light emitting diode chip and at least one heat sink provided at the body), and a light guide plate arranged or provided at a side (or on a side) of the light emitting diode package.

A display device may be provided that includes a liquid crystal panel, a backlight unit arranged at a rear side (or on a rear side) of the liquid crystal panel, and a drive unit for driving the backlight unit. The backlight unit may include a frame having a surface plate and a bottom plate formed with at least one hole, a circuit board arranged on an upper surface of the bottom plate, a light emitting diode package arranged on an upper surface of the circuit board and including a body having a light emitting diode chip and at least one heat sink provided at the body, and at least one light guide plate arranged or provided at a side of the light emitting diode package.

Embodiments may provide several advantages, such as the following.

A heat sink may be provided separately from an external lead terminal, so as to radiate heat generated from a light emitting diode chip to the outside. This may enhance a lifespan of the light emitting diode chip.

The heat sink provided for radiation of heat may also be used as an external lead terminal. This may allow a plurality of light emitting diode chips to be packaged simultaneously, resulting in enhancements in light efficiency and radiation characteristics.

Since the lead terminal and the heat sink are configured so as not to protrude out of the package, enhanced light incidence efficiency to a light guide plate may be accomplished and the resulting light emitting diode package may be applicable to a slim backlight unit.

The present disclosure also provides a "green" technology for display devices. Presently, the backlight is generally turned on continuously, even when the display of the entire screen is not desirable. For example, the prior art display allows control of the resolution of the entire display screen but not the size of the display screen. However, in certain instances, a smaller screen area may be desirable for lower resolution images. The size of the display area can be controlled based on the present disclosure. For example, instead of viewing images and programs in 42 inch display, the display screen size can be reduce to 32 inches by turning off the light sources for appropriate number of light guide plates located at the periphery of the display device. As can be appreciated, the location and size of the display area can be controlled based on program or user needs. As can be appreciated, multiple configuration may be possible based on turning on or off the light sources for appropriate number of light guide plates (light guide panels or light guide modules or assemblies) based on application and user configuration.

This application is related to Korean Applications Nos. 10-2008-0049146 filed on May 27, 2008, 10-2008-0061487 filed on Jun. 27, 2008, 10-2008-0099569 filed on Oct. 10, 2008, 10-2009-0035029 filed on Apr. 22, 200910-2009-0036472 filed Apr. 27, 2009, 10-2009-0061219 filed Jul. 6, 2009, 10-2009-0071111 filed Aug. 2, 2009, 10-2009-0072449 filed Aug. 6, 2009, 10-2009-0075120 filed on Aug. 14, 2009, 10-2009-0080654 filed Aug. 28, 2009, and 10-2009-0098901 filed on Oct. 16, 2009, whose entire disclosures are incorporated herein by reference. Further, this application is related to U.S. Provisional Patent Application Nos. 61/219,480 filed on Jun. 23, 2009; 61/229,854 filed on Jul. 30, 2009; 61/230,844 filed on Aug. 3, 2009; 61/233,890 filed on Aug. 14, 2009; and 61/237,841 filed on Aug. 28, 2009 and U.S. application Ser. Nos. 12/453,885 filed on May 22, 2009, 12/618,603 filed on Nov. 13, 2009, 12/632,694 filed on Dec. 7, 2009, and 12/727,966, 12/728,031, 12/728,065, 12/728,087, 12/728,111, and 12/728,131 all filed on Mar. 19, 2010, whose entire disclosures are incorporated herein by reference.

It will be apparent to those skilled in the art that various modifications and variations can be made in the present disclosure without departing from the spirit or scope of the disclosure. Thus, it is intended that the present disclosure cover the modifications and variations of this disclosure provided they come within the scope of the appended claims and their equivalents.

Any reference in this specification to "one embodiment," "an embodiment," "example embodiment," etc., means that a particular feature, structure, or characteristic described in connection with the embodiment is included in at least one embodiment of the disclosure. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting diode package comprising:
a body that includes a head part and a body part, the head part including a first surface and a second surface perpendicular to the first surface, the second surface configured to receive a light emitting diode chip, the body part including a heat sink having a first surface, wherein the first surface of the head part and the first surface of the heat sink are co-planar.

2. The light emitting diode package of claim 1, wherein a light emitting diode chip provided on the second surface emits light having a wavelength of 430 nm to 480 nm.

3. The light emitting diode package of claim 2, wherein fluorescent substance is provided on the second surface of the head part.

4. The light emitting diode package according to claim 1, wherein the body part further includes a positive lead terminal and a negative lead terminal spaced from each other.

5. The light emitting diode package according to claim 1, wherein the heat sink is configured to be one of to a positive lead terminal or a negative lead terminal.

6. The light emitting diode package according to claim 1, wherein the heat sink includes:
a first heat sink electrically connected to the positive lead terminal; and
a second heat sink electrically connected to the negative lead terminal.

7. The light emitting diode package according to claim 6, wherein the first heat sink and the second heat sink are spaced apart and face each other.

8. The light emitting diode package according to claim 1, further comprising a lead terminal electrically connected to the light emitting diode chip,
wherein the body includes a first recess to accommodate the heat sink, and at least one second recess to accommodate the lead terminal.

9. The light emitting diode package according to claim 1, wherein a central region of the body includes the first recess.

10. The light emitting diode package according to claim 8, wherein an outer surface of the lead terminal and an outer surface of the body are co-planar.

11. The light emitting diode package according to claim 1 wherein the first surface of the heat sink and an outer surface of the body are co-planar.

12. A backlight unit comprising:
at least one light guide plate having a light incidence part to receive light from a first direction and a light emitting part adjacent to the light incidence part to emit light received from the light incidence part in a second direction, the first and second directions being different directions; and
light source, the light source including at least one light emitting diode package, the at least one light emitting diode package having a body that includes a head part and a body part, the head part including a first surface and a second surface perpendicular to the first surface, the second surface configured to receive a light emitting diode chip, and the body part including at least one heat sink, and the light incidence part provided adjacent to the second surface of the head part.

13. The backlight unit according to claim 12, wherein the at least one heat sink is electrically connected to the light emitting diode chip.

14. The backlight unit according to claim 12, wherein the body part of the at least one light emitting diode package further includes a positive lead terminal and a negative lead terminal spaced from each other.

15. The backlight unit according to claim 14, wherein the at least one heat sink is electrically connected to the positive lead terminal or the negative lead terminal.

16. The backlight unit according to claim 15, wherein the at least one heat sink includes:
a first heat sink electrically connected to the positive lead terminal; and a second heat sink electrically connected to the negative lead terminal.

17. The backlight unit according to claim 12, wherein the light source further comprises a circuit board, the at least one heat sink of the at least one light emitting diode package being in contact with the circuit board.

18. The backlight unit according to claim 17, wherein a radiation pad is on a side of the circuit board which is opposite from a side where the heat sink contacts the circuit board.

19. A display device including the backlight unit of claim 12, wherein the display device includes:
 a liquid crystal panel provided adjacent to the backlight unit;
 a frame to support the backlight unit; and
 a drive unit provided on the frame for driving the backlight unit.

\* \* \* \* \*